United States Patent
Cumings et al.

(10) Patent No.: US 6,709,566 B2
(45) Date of Patent: Mar. 23, 2004

(54) METHOD FOR SHAPING A NANOTUBE AND A NANOTUBE SHAPED THEREBY

(75) Inventors: John P. Cumings, Oakland, CA (US); Alex K. Zettl, Kensington, CA (US)

(73) Assignee: The Regents of the University of California, Oakland, CA (US)

( * ) Notice: Subject to any disclaimer, the term of this patent is extended or adjusted under 35 U.S.C. 154(b) by 309 days.

(21) Appl. No.: 09/915,207

(22) Filed: Jul. 24, 2001

(65) Prior Publication Data

US 2002/0053522 A1 May 9, 2002

Related U.S. Application Data

(60) Provisional application No. 60/220,549, filed on Jul. 25, 2000.

(51) Int. Cl.[7] .............................. B23K 31/00; B23H 9/08
(52) U.S. Cl. ...................... 205/641; 205/662; 205/664; 219/61.4; 219/162
(58) Field of Search ................................ 205/641, 662, 205/664; 219/61.4, 162

(56) References Cited

U.S. PATENT DOCUMENTS

| | | |
|---|---|---|
| 5,916,642 A | 6/1999 | Chang |
| 6,159,742 A | 12/2000 | Lieber et al. |
| 6,203,814 B1 | 3/2001 | Fisher et al. |
| 6,231,980 B1 | 5/2001 | Cohen et al. |
| 6,239,547 B1 | 5/2001 | Uemura et al. |

OTHER PUBLICATIONS

Collins et al. (1997), "Nanotube Nanodevice," *Science* 278:100–103, No month.
Cumings et al. (2000), "Peeling and Sharpening Multiwall Nanotubes," *Nature* 406:586, No month.
Dresselhaus et al. (1998), "Carbon Nanotubes," *Physics World* 11(1), No month.
Falvo et al. (1997), "Bending and Buckling of Carbon Nanotubes Under Large Strain," *Nature* 389:582–584No month.
Falvo et al. (1998), "Nanomanipulation Experiments Exploring Frictional and Mechanical Properties of Carbon Nanotubes," *Miscrospy and Microanalysis* 4:504–512, No month.
Falvo et al. (1999), "Nanometre–Scale Rolling and Sliding of Carbon Nanotubes," *Nature* 397:236–238, No month.
Iijima (1998), "Carbon Nanotubes and Their Recent Developments," *IEEE Eleventh Annual International Workshop on Micro Elector Mechanical Systems*, IEEE, Heidelberg, Germany, pp. 520–525, No month.
Paulson et al. (1999), "In Situ Resistance Measurements of Strained Carbon Nanotubes," *Applied Physics Letters* 75(19):2936–2938, No month.
Sloan et al. (2000), "The Size Distribution, Imaging and Obstructing Properties of $C_{60}$ and Higher Fullerenes Formed within Arc–Grown Single Walled Carbon Nanotubes," *Chemical Physics Letters* 316:191–198, No month.

(List continued on next page.)

*Primary Examiner*—Arun S. Phasge
(74) *Attorney, Agent, or Firm*—Reed & Eberle LLP; Louis L. Wu

(57) ABSTRACT

The invention relates to a method for shaping small three-dimensional articles such as nanotube exhibiting a layered structure through material removal such that the article is controllably shaped to exhibit a desired contour. Typically, material removal does not require use of a chemical etchant and is carried out while the article and a shaping electrode are positioned in contact material removal relationship with under a potential difference. The invention also relates to nanotubes and small three-dimensional articles exhibiting a layered structure having a controllably shaped contour.

24 Claims, 1 Drawing Sheet

OTHER PUBLICATIONS

Wagner et al. (1998), "Stress–Induced Fragmentation of Multiwall Carbon Nanotubes in a Polymer Matrix," *Appl. Phys. Letters* 72(2):188–190, No month.

Yu et al. (2000), "Strength and Breaking Mechanism of Multiwalled Carbon Nanotubes Under Tensile Load," *Science* 287:637–640, No month.

Yu et al. (2000), "Controlled Sliding and Pullout of Nested Shells in Individual Multiwalled Carbon Nanotubes," *J. Phys. Chem. B* 104:8764–8767, No month.

Tsang et al. (1993), "Thinning and Opening of Carbon Nanotubes by Oxidation Using Carbon Dioxide," *Nature* 362:520–522, No month.

Zettl et al. (2000), "Sharpened Nanotubes, Nanobearings, and Nanosprings," *Electronic Properties of Novel Materials—Molecular Nanostructures*, $14^{th}$ International Winterschool/Euroconference, Kirchberg, Austria, No. 544, pp. 526–532, No month.

Bachtold et al. (1999), "Aharonov–Bohm Oscillations in Carbon Nanotubes," *Nature* 397:673–675, No month.

Britto et al. (1996), "Carbon Nanotube Electrode for Oxidation of Dopamine," *Bioelectrochemistry and Bioenergetics* 41:121–125, No month.

Dai et al. (1996), "Nanotubes as Nanoprobes in Scanning Probe Microscopy," *Nature* 384:147–150, No month.

de Heer et al. (1995), "A Carbon Nanotube Field–Emission Electron Source," *Science* 270:1179–1180, No month.

Frank et al. (1998), "Carbon Nanotube Quantum Resistors," *Science* 280:1744–1746, No month.

Freemantle (1996), "Filled Carbon Nanotubes Could Lead to Improved Catalysts and Biosensors," *Chemical & Engineering News* 74:62–66, No month.

Kong et al. (1998), "Synthesis of Individual Single–Walled Carbon Nanotubes on Patterned Silicon Wafers," *Nature* 395:878–881, No month.

Tsang et al. (1994), "A Simple Chemical Method of Opening and Filling Carbon Nanotubes," *Nature* 372:159–162, No month.

METHOD FOR SHAPING A NANOTUBE AND A NANOTUBE SHAPED THEREBY

CROSS-REFERENCE TO RELATED APPLICATIONS

This application claims priority under 35 U.S.C. § 119(e)(1) to U.S. Provisional Patent Application Ser. No. 60/220,549, filed Jul. 25, 2000.

TECHNICAL FIELD

The present invention relates to nanotube shaping. In particular, the invention relates to a nanotube that exhibits a controllably shaped or "made-to-order" geometric contour and to a method for shaping a nanotube material having a layered structure.

BACKGROUND

Microfabrication represents a high-priority research area within a wide range of fields such as electronics, mechanical devices, chemical processes and biological systems. As a result, a number of techniques have been developed to shape the contour of microscopic, three-dimensional solid articles. Such techniques include both additive and subtractive processes, often involving lithographic techniques. However, lithographic techniques are usually insufficient to produce nanometer-sized features. In addition, the accuracy and precision formation of nanometer-sized features is strongly dependent on both the crystallographic structure of the material to be shape as well as the technique employed. Thus, it is evident that only certain techniques may be employed to shape articles of a certain material when high accuracy and close tolerances are required.

Carbon nanotubes are attractive candidates for a host of applications due to their unique mechanical and electrical properties. For example, carbon nanotubes have found use in catalytic reactions, see Freemantle (1996), "Filled Carbon Nanotubes Could Lead to Improved Catalysts and Biosensors," *Chemical & Engineering News* 74:62–66, electrodes, see Britto et al. (1996), "Carbon Nanotube Electrode For Oxidation of Dopamine," *Bioelectrochemistry and Bioenergetics* 41:121–125, nanoscale electronics, see Collins et al. (1997), "Nanotube Nanodevice," *Science* 278:100–103, nanoscale mechanical systems, see Iijima (1998), Proc. IEEE Eleventh Annual International Workshop on Micro Elector Mechanical Systems (IEEE, Heidelberg, Germany) 520–525, and scanned probe microscope and electron field emission tips, see Dai et al. (1996), "Nanotubes as Nanoprobes in Scanning Probe Microscopy," *Nature* 384:147–150 and deHeer et al. (1995), "A Carbon Nanotube Field-Emission Electron Source," *Science* 270:1179–1180. In addition, a number of patents describe various processes that alter the material characteristics of carbon nanotubes, such as functionalization of nanotube surfaces, see, e.g., U.S. Pat. No. 6,203,814 to Fisher et al., or encapsulation of materials in carbon nanotubes, see, e.g., U.S. Pat. No. 5,916,642 to Chang.

Carbon nanotubes have found use as probes for sensing and manipulating microscopic environments and structures. For example, U.S. Pat. No. 6,159,742 to Lieber et al. describes a carbon-based tip that may be used to reveal chemical characteristics of a sample for scanning probe microscopy. The tip is described as having a structure of the formula: $X—(L—M)_n$ in which n is 1 to 100, X is a carbon-based nanotube having a first end and a second end, L is a linking group bonded at the first end of the carbon-based nanotube, and M is a molecular probe bonded to the linking group. The second end of the carbon-based nanotube X is adapted for attachment to a cantilever configured for microscopy. The linking group L may be a functional moiety such as an amino, amido, carbonyl, carboxyl, alkyl, aryl, ether, or ester group. While this patent describes the attachment of a nanotube to another solid article, the nanotube itself is not controllably shaped.

Similarly, U.S. Pat. No. 6,239,547 to Uemura et al. describes a method for forming an electron-emitting source in which the carbon nanotubes are fixed to a substrate. This method involves preparing a paste by dispersing, in a conductive viscous solution, a plurality of needle-like structures each made of an aggregate of carbon nanotubes. A pattern of this paste is formed on the substrate. Non-needle-like portions are removed to a predetermined degree from the surface of the pattern through laser irradiation or plasma processing, to at least partially expose the needle-like structures. As a result, an electron-emitting source in which the carbon nanotubes are fixed to the substrate is formed. Thus, while this subtractive method allows a nanotube to be attached to a substrate so that the needle-like structure of the nanotube is exposed, the material removal process does not controllably shape the nanotube.

Thus, for use as probes or other applications, it would be desirable to control or shape nanotube geometry. Although recent progress has been made in the growth of nanotubes at pre-selected sites, see Kong et al. (1998), "Synthesis of Individual Single-Walled Carbon Nanotubes on Patterned Silicon Wafers," *Nature* 395:878–881, and the modification of nanotube ends through chemical etching, see Tsang et al. (1994), "A Simple Chemical Method of Opening and Filling Carbon Nanotubes," *Nature* 372:159–162, fine control over nanotube shaping has not been possible. When nanotubes are grown, they exhibit a substantially constant cross-sectional dimension along their longitudinal axis. Therefore, while it is possible to grow a plurality of nanotubes of differing diameters, each nanotube exhibits only one diameter. Similarly, known chemical etching techniques do not provide adequate control over the shaping of the contour of a nanotube. While chemical etching removes material from nanotube, targeted material removal from a specific location on the nanotube is currently beyond the capability of those skilled in the art. Often, nanotubes comprising a layered material undergo uncontrolled exfoliation when exposed to an etchant.

There is therefore a need for a method of shaping nanotubes to exhibit a desired or made-to-order contour, particularly nanotubes having a layered structure.

SUMMARY OF THE INVENTION

Accordingly, it is an object of the present invention to overcome the above-mentioned disadvantages of the prior art by providing a method for the controllable shaping of nanotubes to exhibit a desired contour.

It is another object of the invention to provide nanotubes that exhibit a controllably shaped contour.

Additional objects, advantages and novel features of the invention will be set forth in part in the description that follows, and in part will become apparent to those skilled in the art upon examination of the following, or may be learned through routine experimentation upon practice of the invention.

In one embodiment, the invention relates to a method for shaping a nanotube through the use of a shaping electrode to remove material from a portion of the nanotube so that the nanotube is controllably shaped to exhibit a desired contour. The material removal is carried out while the nanotube and the shaping electrode are under a potential difference. Typically, the potential difference is no more than about 10 volts. However, the potential difference is preferably no more than about 5 volts and is optimally about 0.5 to about 3.0 volts. In addition, it is preferred that the potential of the nanotube is at or near ground.

Depending on the potential difference, material removal may take place when the shaping electrode contacts the nanotube or when the shaping electrode is sufficiently close to the nanotube. Thus, material removal may not require contact between the shaping electrode and the nanotube. In some instances, material removal can be carried out by first placing a shaping electrode in contact with the nanotube when the shaping electrode and the nanotube do not exhibit a sufficient potential difference for material removal from the nanotube, and then controllably increasing the potential difference between the electrode and the nanotube to remove material from a portion of the nanotube, thereby shaping the nanotube to exhibit a desired contour. In other instances, the shaping electrode is placed in a noncontacting yet shaping spatial relationship with the nanotube when the shaping electrode and the nanotube do not exhibit a sufficient potential difference for material removal and then controllably increasing the potential difference between the electrode and the nanotube to remove material from a portion of a nanotube thereby shaping the nanotube to exhibit a desired contour.

To provide precise removal control, material removal may be carried out via successive removal of layers from the exterior surface of the nanotube. Shaping of the nanotube contour, via successive layer removal or otherwise, can be monitored from the electrical characteristics of the nanotube. Preferably, the shaping of the nanotube is carried out "blindly." That is, monitoring of the electrical characteristic is carried out alone, without the accompaniment of any other technique such as microscopy. While any of a number of shaping electrodes may be employed, the preferred shaping electrode comprises an additional nanotube. This additional nanotube may be comprised of the same material as the nanotube to be shaped or may be comprised of a different material. Typically, the additional nanotube is larger than the nanotube to be shaped.

Although the method can be employed to shape the nanotube so that the shaped nanotube exhibits any desired contour, a tapered contour can be advantageously employed in a number of contexts and is thus preferred.

In another embodiment, the invention relates to a method for shaping a solid article. The method involves the use of a shaping electrode comprising a nanotube to remove material from a portion of a solid article such that the solid article is controllably shaped to exhibit a desired contour. As before, material removal is carried out while the solid article and the shaping electrode are under a potential difference. Typically, the solid article is comprised of material having a layered structure. Thus, material removal involves removing one or more outer layers of material from the solid article.

In still another embodiment, the invention relates to a method for shaping a nanotube by removing material from a portion of the nanotube through controlled application of energy until the nanotube exhibits a desired contour, wherein material removal is carried out without need for a chemical etchant.

In a further embodiment, the invention relates to a nanotube having a controllably shaped contour and a varying cross-sectional dimension along the longitudinal axis. Typically, the nanotube is comprised of a material having a layered structure such as carbon, boron nitride, boron carbide, carbon nitride, carbon boron nitride, or a transition metal chalcogenide. Preferably the material is carbon.

When the nanotube comprises material having layered structure, it is typical for at least a portion of the nanotube to have 1 to about 1000 layers, with 1 to about 100 layers preferred, and about 2 to about 50 layers most preferred.

The nanotube may be made to order to conform to any of a number of desired contours. Often, it is desired that the contour be tapered. Thus, the cross-sectional dimension of the nanotube along the longitudinal axis may vary by up to about 100-fold but more typically varies by about 2-fold to about 10-fold. The nanotube may be substantially symmetric or asymmetric about the longitudinal axis. When it is important to ensure that the contour is smooth, it is preferred that the nanotube exhibits substantially no exfoliation.

Such a nanotube may represent component of a catalyst, an electrode such as a biological cell electrode, an electronic system, a mechanical system, an emission tip such as an electron field emission tip or a scanned probe microscope emission tip, or a probe for biological insertion. The probe, e.g., may be hollow tube to allow the delivery of a compound through the lumen of the tube.

In a still further embodiment, the invention relates to a three-dimensional object comprising a material having a layered structure and having a controllably shaped exterior contour, wherein at least one dimension of the solid article does not exceed about 100 nm in length.

BRIEF DESCRIPTION OF THE DRAWINGS

All figures referred to herein are transmission electron microscope (TEM) images that illustrate an example of the inventive method for shaping a multiwall carbon nanotube.

DETAILED DESCRIPTION OF THE INVENTION

Figure 1:
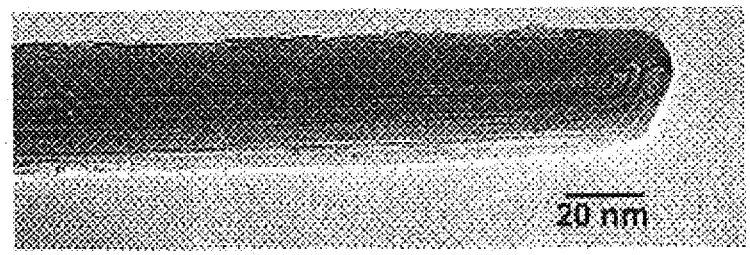
FIG. 1 illustrates a nanotube in a pristine form before shaping.

Before the invention is described in detail, it is to be understood that unless otherwise indicated this invention is not limited to particular materials, components or manufacturing processes, as such may vary. It is also to be understood that the terminology used herein is for purposes of describing particular embodiments only, and is not intended to be limiting.

It must be noted that, as used in the specification and the appended claims, the singular forms "a," "an" and "the" include plural referents unless the context clearly dictates otherwise. Thus, for example, reference to "a nanotube" includes a single nanotube as well as two or more nanotubes, "a shaping electrode" includes a single shaping electrode as well as two or more an assembly of shaping electrodes, "a layer" may be a single layer or may comprise two or more layers, and the like.

In this specification and in the claims that follow, reference will be made to a number of terms that shall be defined to have the following meanings unless the context clearly indicates otherwise:

The term "contour" is used herein in its ordinary sense and typically refers to the profile or outline of the exterior surface of an item.

The term "exfoliate" is used herein in its ordinary sense and refers to a process wherein portion of layers of a three-dimensional object are uncontrollably separated in scales or laminae from the object.

The term "layered structure" as in "a material having a layered structure" as used herein refers to a crystalline structure wherein certain atoms of the structure are held together by directed covalent, ionic or other strong bonds in a hexagonal or other array to form layers, planar or otherwise, while bonds transverse to the layers are formed as a result of weak forces such as van der Waal forces. Examples of materials exhibiting a layered structure include carbon (e.g., graphite) boron nitride, boron carbon nitride and transition metal dichalcogenides such as $FeS_2$ and $TiS_2$. The term "layered structure" does not limit the shape or orientation of the layers. For example, graphite typically exhibits a structure having planar layer while multiwalled carbon nanotubes exhibit structure having concentric cylindrical layers, and multilayered fullerenes may exhibit a structure having concentric spherical layers.

The term "nanotube" as used herein refers to a solid, cylindrically shaped and discrete fibril typically characterized by a substantially constant diameter of typically about 1 nm to about 100 nm, preferably about 2 nm to about 50 nm. In addition, the nanotube typically exhibits a length greater than about 10 times the diameter, preferably greater than about 100 times the diameter. The term "multiwall" as used to describe nanotubes refers to nanotubes having a layered structure, such as a fullerene-like structure, so that the nanotube comprises an outer region of multiple continuous layers of ordered atoms and an optional distinct inner core region or lumen. The layers are disposed substantially concentrically about the cylindrical axis of the fibril.

The term "potential" is used herein in its ordinary sense and describes an electrostatic phenomenon as a scalar quantity. Thus, the term "potential difference" is used in its ordinary sense to refer to the change in potential energy by a test charge. Similarly, the term "ground" refers to the potential of an effectively infinite sink to which electrons can easily migrate.

The term "solid" is used herein refers to an article that has a definite shape and volume rather than being a fluid. Thus, the term does not exclude an article that has a definite shape and volume even if the article contains void volume therein. For example, a hollow tube having a definite shape and volume is considered a solid even though the tube contains a lumen.

The term "transition metal chalcogenide" is used herein in its ordinary sense and refers to a compound having at least one metallic element having an incomplete inner electron shell, marked by multiple valences and at least one element from Group 16 of the period table. As used herein all reference to the elements and groups of the Periodic Table of the Elements is to the version of the table published by the Handbook of Chemistry and Physics, CRC Press, 2000, which sets forth the new IUPAC system for numbering groups. Thus, the term "transition metal chalcogenides" include mixed metal chalcogenides, metal mixed chalcogenides and mixed metal mixed chalcogenides. Preferred transition metals include titanium, zirconium, hafnium, vanadium, niobium, tantalum, chromiuim, molybdenum, tungsten, iron, ruthenium, osmium, cobalt, nickel, copper and silver. Preferred chalcogens include sulfur, selenium and tellurium.

Thus, the invention relates to a technique for systematically shaping nanotubes through material removal to exhibit a "made to order" contour after their synthesis. When such nanotubes are grown to have a layered structure. The technique provides for controlled peeling of individual layers from the nanotubes to result in nanotubes having variable cross-sectional areas along the length of the nanotube.

In one embodiment, the invention relates to a novel, straightforward, and reliable method that allows highly controlled engineering or shaping of nanotubes. With this method, an ordinary nanotube having a substantially constant cross-sectional area along its longitudinal axis can be converted to exhibit an ideal exterior contour or geometry to serve as a tip for scanned probe, field emission, or biological insertion applications. The method involves providing a nanotube and using a shaping electrode to remove material from a portion of the nanotube such that the nanotube is controllably shaped to exhibit a desired contour. Material is removed while the nanotube and the shaping electrodes are under a potential difference.

For example, the "ideal" scanned probe, field emission, or biological electrode tip should be long, stiff and tapered for optimal mechanical response, and in some cases have an electrically conducting tip. In such a case, the inventive process may be employed to "sharpen" an end of a multiwalled nanotube to form such a tip having a tapered contour. See Cumings et al. (2000) *Nature* 406:586. The shaping process involves applying a potential difference between the nanotube and the shaping electrode. Exterior nanotube layers are successively removed near the end of the nanotube, leaving the interior nanotube walls intact. Thus, at one end, formerly interior nanotubes are exposed and protrude from an opposing end having intact exterior nanotube walls. This peeling and sharpening process can be repeatedly applied to the same nanotube until the very innermost small-diameter tube or tubes are exposed. The sharpened tip thus formed exhibits a radius of curvature comparable to that of one single-walled nanotube.

The nanotube may be comprised of any material but is preferably comprised of a material that exhibits a layered structure. Materials having a layered structure include, but are not limited to, carbon, boron nitride and transition metal chalcogenides. It should be noted that certain materials may exhibit polymorphism and that the layered polymorph of such materials is preferred to the nonlayered structure. For example, carbon may exist as graphite, which has a layered structure, as diamond, which has a three-dimensional crystalline structure, or as acetylene black, which has a generally amorphous structure. In the case of carbon, the nanotube preferably exhibits a cylindrically layered structure although other forms of carbon fibers may be suitable for use in the present invention as well. Thus, for example, carbon fibers that have been under commercial production for some time having diameters generally above 50 nanometers and varying degrees of order may be employed. Similarly, it is known that boron nitride may exhibit a layered structure as well as a three-dimensional diamond structure, and the layered structure for boron nitride is preferred in the present invention as well. It is also envisioned that in some cases, a nanowire may serve as a nanotube that may be shaped through the inventive method. Currently known nanowires include those formed from gold, silver, silicon, bismuth and palladium, although nanowires made from other materials may be suitable for the present invention as well. Notably, such nanowire may exhibit layered or nonlayered structures, and the layered structure is preferred.

Techniques for producing carbon nanotubes are well known in the art. Carbon nanotubes are widely commercially available and may be obtained, for example, from Hyperion Catalysis International, Inc. (Cambridge, Mass.) or from Carbon Nanotechnologies Incorporated (Houston, Tex.). Generally, single-walled carbon nanotubes may be made by one of two methods. The first involves laser ablation of a heated target. In this technique, a laser is used to vaporize a heated carbon target that has been treated with a catalytic metal, usually nickel, cobalt, or iron, or mixtures of these metals. The resulting product is found to consist of bundles, or ropes, of single-walled nanotubes arranged in near closest-packed order. The second method uses a DC carbon arc to vaporize a carbon electrode impregnated with a metal (Fe, Co, Ni, or mixtures of these metals with other catalytic such as yttrium). These methods may be adapted to produce multiwalled nanotubes.

Another technique for producing carbon nanotubes involves chemical vapor deposition. Chemical vapor deposition, catalytically assisted or otherwise, is a well established method for synthesis of a wide range of materials including nanofibers of many different materials. The primary advantage of this technique is that it involves a relatively low temperature process and is suitable for large-scale production. The technique employs a furnace at an elevated temperature that contains a surface on which a hydrocarbon gas (such as acetylene, ethylene, methane etc.) is decomposed into carbon and hydrogen. Hydrogen is liberated as $H_2$ gas while carbon is deposited on the surface. Optionally, the surface on which carbon is deposited is a surface of a metal particle that catalyzes the hydrocarbon decomposition. In such a case, carbon is adsorbed onto the surface of the particles. Then, the adsorbed carbon diffuses into the interior of the particle and is "extruded" from the other side as a fiber. This process continues until the supply of carbon is removed or the metal particle is poisoned.

One such nanotube growth procedure involves four steps, purge and heat, metal particle reduction, nanofiber growth and cool down. Depending on the specific conditions employed, hydrocarbon decomposition can occur at the wall of the growing nanotube as well as on the metal particle surface. This, in turn, may result in nanotube thickening as well as growth of additional amorphous structure. Feedstock gas is an important parameter for the control of nanotube formation. Accordingly, feedstock gas type, composition, flow rate and pressure may be monitored when chemical vapor deposition techniques are used. When a catalyst is employed, the catalyst composition, size and shape should also be selected according to the desired properties for the formed nanotube. As a substrate is necessary to act as a support for the catalytic particles from which the nanofibers grow, the substrate itself can affect the growth characteristics of the fibers. It should be noted that carbon nanotubes in some instances may be grown without use of a catalyst, although the yield of nanotubes with respect to other carbon structures tends to be lower when no catalyst is employed.

The above-described techniques may be employed to form various three-dimensional articles such as nanotubes exhibiting tapered, needle-like tips as well as others having distinctively capped blunt ends. In addition, multiwalled nanoparticles such as "onions" and "nanohorns" may be formed as byproducts of such processes. Further, these techniques may form articles that either contain no carbon or contain elements other than carbon. For example, U.S. Pat. No. 6,231,980 to Cohen et al. describes a nanotube comprising a crystalline structure of $B_xC_yN_z$, where x, y, and z indicate the stoichiometry of the nanotube composition. X is typically in the range of about 0 to 1, y is typically in the range of 0 to 3 and z is in the range of about 0 to 1 wherein at least two of x, y and z are nonzero. Thus, for example, the proportion of x, y and z many be selected from the group consisting of about 1:2:1, about 1:3:0, about 1:0:1, and about 0:1:1. Such nanotubes may be formed by adapting traditional nanotube formation technologies as discussed above. That is, these nanotubes may be formed by preparing anode rods having appropriate structures and B—C—N compositions and subsequently electrically arcing the rods against pure graphite cathodes. As a result multiwalled crystalline nanotubes can be formed having diameters from about 10 nm to about 0.1 and lengths from about 0.1 to about 0.3 μm. Transition metal chalcogenides represent another material that has been formed into a nanotube. See U.S. Pat. No. 5,958,358 to Tenne et al. Other material that have been may be formed as multiwalled nanotubes include, but are not limited to GaSe, $NiCl_2$, $TiO_2$, $Sb_2S_3$, $K_4Nb_6O_{17}$, $PbNb_mS_{(2m+1)}$, where m is an integer from 1 to 10, and $W_aMo_bC_cS_2$ where a is in the range of 0 to 1, b is in the range of 0 to 3 and c is in the range of 0 to 4. Thus, for example, the ratio of a:b:c may be selected from the group consisting of about 0:1:0, of about 1:2:1, about 1:3:0, about 1:0:1, about 0:1:1, and about 0:3:4. Optionally, these materials may be doped with trace amounts of any of a number of elements to improve certain properties of the materials for a particular purpose, e.g., to decrease the electronic band gap to achieve improved electrical conductivity.

As discussed above, once a nanotube is provided, a shaping electrode is used to remove material from a portion of the nanotube to controllably shape the nanotube to exhibit a desired contour. In order to controllably position the shaping electrode with respect to the nanotube, at least one of the shaping electrode and the nanotube to be shaped should be immobilized while the other is moved. It is preferred that one end of the nanotube is attached to a suitable electrically conductive substrate during the shaping process. Both the substrate and materials employed to attach the nanotube to the substrate should be made from a material that does not represent a source of contamination during the shaping process. Thus, the substrate may be formed from an inert material such as gold, platinum or other noble metal and the attachment may be made via a solid carbonaceous material deposited on to the surface of the conducting substrate. Such methods are described in Yu et al. (2000) *Science* 287:637–640. As discussed in Yu et al., the carbonaceous material is deposited by focusing an electron beam at the desired location on the substrate. The electron beam disassociates residual organic species on the substrate surface, which are then deposited onto the substrate surface. The rate at which the carbonaceous material is deposited on the substrate is dependent upon the imaging parameters, the vacuum quality, and surface contamination on the substrate. Additionally, organic contamination on the substrate surface may also migrate toward the focal point of the electron beam and be dissociated and deposited. Other suitable methods of attaching the nanotube to the substrate include, but are not limited to: employing adhesives known in the art such as acrylates, methacrylates or epoxies (in liquid, tape of other forms); employing electrostatic forces; spot welding; mechanical clamping or fixing; exploiting the chemical affinity between the substrate and the nanotube; or synthesizing the nanotube on the substrate. In addition, such methods may be employed in combination. For example, during nanotube synthesis, a number of other phases may also be synthesized from an aggregate that encapsulates the nanotube. Such an aggregate may be immobilized with respect to a substrate using a conductive adhesive. Then, mechanical energy may be applied to the aggregate to fracture the aggregate. As a result, the nanotube is exposed.

Preferably, the nanotube is electrically conductive as well. However, conductivity is not an absolute requirement. It is likely that a greater potential difference between the nanotube and the shaping electrode will be required to shape an insulating nanotube.

To ensure that the nanotube and the shaping electrode are appropriately positioned and oriented, any of a number of nanomanipulators such as those used in electron microscopy may be employed or adapted for the present invention. The nanomanipulator is generally an atomic force microscope probe, although other suitable nanomanipulators may be used, and are commercially available. Any of a number of nanomanipulators (also termed "nanopositioners") such as those used in electron microscopy may be employed or adapted for the present invention. Nanomanipulators are commercially available and may be obtained, for example, from Piezomax Technologies, Inc (Middleton, Wis.) or 3rdTEch, Inc. (Chapel Hill, N.C.). Further information regarding the manipulation of nanotubes can be found in Falvo et al. (1999), "Rolling and sliding of carbon nanotubes," *Nature* 397:236–238, Falvo et al. (1998), "Nanomanipulation experiments exploring frictional and mechanical properties of carbon nanotubes," *Microscopy and Microanalysis* 4:504–512, Falvo et al. (1997), "Bending and buckling of carbon nanotubes under large strain," *Nature* 389:582–584, Paulson et al. (1999), "In situ resistance measurements of strained carbon nanotubes," *App. Phys. Lett.* 75(19):2936–2938. In order to provide accuracy and precision in nanotube shaping, the shaping electrode may exhibit a small contact surface. Thus, the shaping electrode may comprise an additional nanotube comprised of the same material as the nanotube to be shaped. Typically, the additional nanotube is larger than the nanotube to be shaped to exhibit the desired contour. Alternatively, inert metallic shaping electrodes may be employed.

Material is removed while the nanotube and the shaping electrode are under a potential difference. While not wishing to be bound by theory, it is believed that inventive process, when employed to shape multiwalled nanotubes, does not involve the uniform Joule heating of the nanotube. Instead, it is more likely that multiwalled nanotube conduct ballistically. See Frank, et al. (1998), "Carbon nanotube quantum resistors," *Science* 280:1744–1746. In addition, the energy to break the bonds and remove the multiwalled nanotube layers likely originates from highly localized dissipation at defect scattering sites, located primarily at the ends of the tube. The fact that only the outer layers are affected suggests that electrical current in multiwalled nanotubes flows primarily in just the outer layers of the tube, consistent with the conclusions of recent multiwalled nanotube magnetotransport experiments. See Bachtold et al. (1999), "Aharonov-Bohm oscillations in carbon nanotubes," *Nature* 397:673–675. In short, it is believed that multiwalled nanotubes may be shaped through a "peeling" process in which each layer of the nanotube may be controllably and individually removed. Thus, the layered structure of certain materials may be exploited to provide greater control over precision and accuracy of material. Although the invention may be employed to shape the contour of any nanotube, irrespective of whether the nanotube is comprised of a layered material, it is preferred in the case of multiwalled nanotubes that material removal is carried out through successive removal of layers from an exterior surface of the nanotube.

In order to provide localized heating of the nanotube resulting in material removal through vaporization, the potential difference between the nanotube and the shaping electrode must be carefully monitored and controlled. To avoid excessive heating, the typical potential difference applied is no more than about 10 volts when a multiwalled carbon nanotube is to be shaped. Preferably, the potential difference is no more than about 5 volts. Optimally, the potential difference is about 0.5 to about 3.0 volts. Other voltage differences may be employed to shape noncarbon materials and may be determined through routine experimentation. For operational ease, the potential of one of the nanotube and shaping electrode is at or near ground. When the nanotube is rendered immobile during material removal, it is preferred that the potential of the nanotube is at or near ground. In addition, material removal should take place in vacuum since gases ordinarily considered inert, e.g., nitrogen, may react with the nanotube.

In order to remove material from the nanotube, the shaping electrode must be located in sufficient proximity to provide energy for controllably vaporizing selected locations on the surface of the nanotube. Thus, it is preferred that shaping electrode contacts the nanotube during step during material removal. Alternatively, the shaping electrode may not contact the nanotube during material removal as long as a sufficiently large potential difference is provided between the nanotube and the shaping electrode. In some instances, material removal can be carried out by first placing the shaping electrode in contact with the nanotube when the shaping electrode and the nanotube do not exhibit a sufficient potential difference for material removal from the nanotube and then controllably increasing the potential difference between the electrode and the nanotube to remove material from the exterior surface of the nanotube. In other instances, the shaping electrode may be placed in a noncontacting yet proximal relationship with the nanotube whereby the shaping electrode and the nanotube do not exhibit a sufficient potential difference for material removal. Once in place, the potential difference between the electrode and the nanotube is then controllably increased, thereby remove material from the nanotube.

As another option, a constant potential difference may be generated between the nanotube and the shaping electrode when they are not in proximal relationship with each other. Then, under the constant potential difference, the nanotube and the shaping electrode are brought into a proximal or contacting relationship effective to remove the material from the nanotube. Thus, modification of both the relative distance and potential difference between the nanotube and the shaping electrode may be used to control the removal of material from the nanotube.

Regardless of whether the nanotube is layered, it is important to monitor material removal to ensure that the final form of the shaped nanotube conforms to a desired contour. Thus, material removal may be carried out while the shape of the nanotube contour is monitored from the electrical characteristics of the nanotube. In the case of conductive nanotubes, the shape of the nanotube contour may be monitored from only the electrical characteristics of the nanotube, for example, without employing electron microscopy to generate an visual image of the nanotube. In other words, the invention is advantageous over other shaping processes in which the shaping process may be monitored "blindly."

In another embodiment, the invention relates to a method for shaping a three-dimensional solid article that may or may not be a nanotube. In this method, a three-dimensional solid article is provided and a shaping electrode comprising a nanotube is used to remove material from a portion of the solid article such that the solid article is controllably shaped to exhibit a desired contour. Again, material removal is carried out while the solid article and the shaping electrode are under a potential difference. Because the nanotubes provide for a small contact area, the method allows for the controllable shaping of three-dimensional articles to exhibit a precise and accurate contour that has not been previously achieved. As before, it is preferred that the solid article be comprised of a material having a layered structure and that the material removal step involves layer-by-layer removal of material from a portion of the solid article. This invention may be used whenever high precision and accuracy is required but is particularly suited for shaping the profile of small articles having at least one dimension that does not exceed about 100 nm in length, such as nanotubes, nanohorns and nanoonions as described above.

In a further embodiment, the invention relates to a method for shaping a nanotube by removing material from a portion of a carbon nanotube through controlled application of energy until the nanotube exhibits a desired contour, wherein material removal is carried out without need for a chemical etchant. As discussed above, the controlled application of energy may be carried out through positioning an electrode at a different potential, either in contact with or in material removal relationship with the nanotube. In addition, other techniques that apply energy to the nanotube may be employed as well, such as laser ablation or other methods to generate intense localized heating of the nanotube. While no chemical etchant is needed, such an etchant may be employed as an adjunct to the controlled application of energy.

In yet another embodiment, the invention relates to a nanotube having a controllably shaped contour and a varying cross-sectional dimension along the longitudinal axis. The nanotube may be formed using any of the above-described methods and may be comprised of a material having a layered structure as discussed above. That is, for example, the material may be selected from the group consisting of carbon, boron nitride, boron carbide, carbon nitride, boron carbon nitride and transition metal chalcogenides but is preferably carbon.

When the nanotube is layered, the varying cross-sectional area may be achieved by varying the number of layers about the longitudinal axis of the nanotube. Thus, the nanotube may have concentric shells (or layers) ranging from 1 to about 1000. Optionally, at least a portion of the nanotube ranges from 1 to about 100 layers. Typically, about 2 to about 50 layers are present in a nanotube. In some instances, the cross-sectional dimension of the nanotube along the longitudinal axis varies by up to about 100-fold. More typically, the cross-sectional dimension of the nanotube along longitudinal axis varies by about 2-fold to about 10-fold. The nanotube may be substantially symmetric or asymmetric about the longitudinal axis. Preferably, the nanotube exhibits substantially no exfoliation.

The nanotube may be used in a number of contexts, many requiring a tapered contour. For example, the nanotube may be employed as a catalyst, an electrode (such as a biological cell electrode), an emission tip (e.g., an electron field emission tip or a scanned probe microscope emission tip), or a probe for biological insertion (that allows insertion into a cell that does not disrupt the cell membrane to a irreparable degree). In particular, when the nanotube is hollow, foreign specifies or objects may be conveyed through the lumen of the nanotube. Thus, a hollow nanotube probe may be used to inject foreign species into a cell without damaging the cell. In short, the nanotube may represent a component of an electronic system or a mechanical system for biological and other applications.

Similarly, the invention also relates to a three-dimensional object comprising a material having a layered structure and having a controllably shaped exterior contour, wherein at least one dimension of the solid article does not exceed about 100 nm in length.

Variations of the present invention will be apparent to those of ordinary skill in the art. For example, the invention may be employed in conjunction with other nanotube processing methods techniques such as that described in copending and commonly assigned U.S. application Ser. No. 09/915,196 ("Telescoped Multiwall Nanotube and Manufacture Thereof"), filed Jul. 24, 2001. In addition, the inventive method may be employed to shape filled nanotubes as well as hollow nanotubes.

It is to be understood that while the invention has been described in conjunction with the preferred specific embodiments thereof, the foregoing description and the example that follows are intended to illustrate and not limit the scope of the invention. Other aspects, advantages and modifications within the scope of the invention will be apparent to those skilled in the art to which the invention pertains.

All patents, patent applications, and publications mentioned herein are hereby incorporated by reference in their entireties.

EXAMPLE

A transmission electron microscope (TEM) was configured with a custom-built mechanical/piezo manipulation stage with electrical feedthroughs to the sample. A conventional arc-grown multiwalled carbon nanotube was attached to a stationary zero-potential gold electrode using a carbonaceous material. The multiwalled nanotube contained approximately 37 walls and had an outer radius of approximately 12.6 nm. FIG. 1 is a TEM image of such a nanotube in a pristine, as grown state. The left end of the nanotube (not seen in the micrograph) is attached to the gold electrode. To the right (also not shown) is a larger nanotube that serves as the shaping electrode. The shaping electrode was attached to the manipulator whose potential can be externally controlled.

Figure 2:
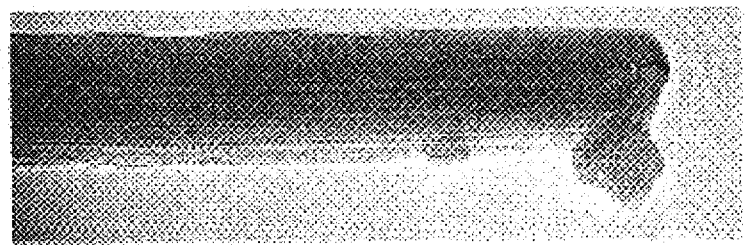
FIG. 2 illustrates the inadvertent transfer of a carbon "onion" to an end of the nanotube from a shaping electrode.

The shaping electrode was momentarily brought into contact with the multiwalled nanotube. As illustrated in FIG. 2, a carbon onion was inadvertently transferred from the shaping electrode to the multiwalled nanotube. A voltage (2.4 V) was applied resulting in a current (170 $\mu$A) passing between the multiwalled nanotube and the shaping electrode. However, the voltage and current was below the shaping threshold. As a result, FIG. 2 illustrates that no peeling or sharpening has occurred.

Figure 3:
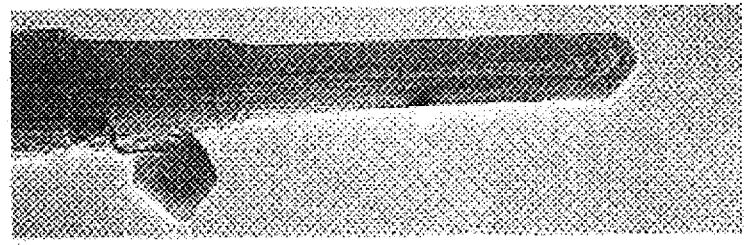
FIG. 3 illustrates a nanotube after an initial material removal step has taken place to remove material from the pristine nanotube. The "onion" of FIG. 2 has simultaneously been displaced to a benign position down the tube axis.

The shaping electrode was been brought into contact with the tip of the multiwalled nanotube at 2.9 V and 200 $\mu$A. At this voltage and current, the shaping threshold had been met. As a result, illustrated in FIG. 3, numerous layers of the multiwalled nanotube was peeled away near the end to the right of the image. Consequently, the multiwalled nanotube exhibited a stepped diameter and is significantly sharpened. Also shown it that the carbon onion has been displaced to a benign position further down the nanotube (to the left). The newly exposed tip of the MWNT was undamaged.

Figure 4:
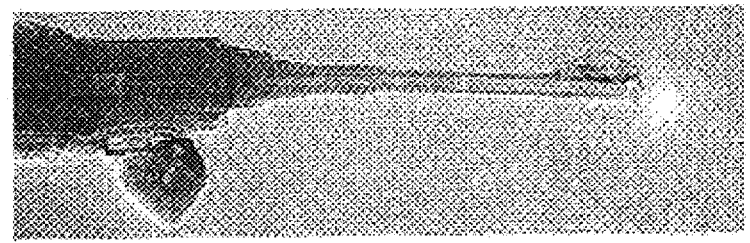
FIG. 4 illustrates the nanotube having a tapered contour that represents an ideal for scanned probe microscopy or electron field emission applications.

The peeling and sharpening process was been repeated, and, as illustrated in FIG. 4, resulted in a multiwalled nanotube with highly desirable characteristics for many nanotube applications. The dominant protruding segment was formed by a three-walled electrically conducting nanotube with a radius of about 2.1 to 2.5 nm. The remaining segment was thick and mechanically rigid along most of its length (not seen in the image). Thus, a multiwalled nanotube exhibiting a stepwisely tapered contour that terminates in a fine sharp (and electrically conducting) tip was formed that is ideal for scanned probe microscopy or electron field emission applications.

We claim:

1. A method for shaping a nanotube, comprising the steps of:
   (a) providing a nanotube and
   (b) using a shaping electrode to remove material from a portion of the nanotube such that the nanotube is controllably shaped to exhibit a desired contour, wherein material removal is carried out while the nanotube and the shaping electrode are under a potential difference.

2. The method of claim 1, wherein the nanotube is comprised of material having a layered structure.

3. The method of claim 2, wherein the material is selected from the group consisting of carbon, boron nitride, boron carbide, carbon nitride, boron carbon nitride and transition metal chalcogenides.

4. The method of claim 3, wherein the material is carbon.

5. The method of claim 2, wherein step (b) is carried out through successive removal of layers from an exterior surface of the nanotube.

6. The method of claim 1, wherein the potential difference is no more than about 10 volts.

7. The method of claim 5, wherein the potential difference is no more than about 5 volts.

8. The method of claim 7, wherein the potential difference is about 0.5 to about 3.0 volts.

9. The method of claim 1, wherein the potential of the nanotube is at or near ground.

10. The method of claim 1, wherein the shaping electrode contacts the nanotube during step (b).

11. The method of claim 10, wherein step (b) comprises:
    (b') placing a shaping electrode in contact with the nanotube when the shaping electrode and the nanotube do not exhibit a sufficient potential difference for material removal from the nanotube; and
    (b") controllably increasing the potential difference between the electrode and the nanotube to remove material from a portion of a nanotube such that the nanotube is shaped to exhibit a desired contour.

12. The method of claim 1, wherein the shaping electrode does not contact the nanotube during step (b).

13. The method of claim 12, wherein step (b) comprises:
    (b') placing a shaping electrode in noncontact yet shaping spatial relationship with the nanotube when the shaping electrode and the nanotube do not exhibit a sufficient potential difference for material removal from the nanotube; and
    (b") controllably increasing the potential difference between the electrode and the nanotube to remove material from a portion of a nanotube such that the nanotube is shaped to exhibit a desired contour.

14. The method of claim 1, wherein step (b) is carried out while the shape of the nanotube contour is monitored from the electrical characteristics of the nanotube.

15. The method of claim 14, wherein step (b) is carried out while the shape of the nanotube contour is monitored only from the electrical characteristics of the nanotube.

16. The method of claim 1, wherein the shaping electrode comprises an additional nanotube.

17. The method of claim 16, wherein the additional nanotube comprises the same material as the nanotube to be shaped to exhibit the desired contour.

18. The method of claim 16, wherein the additional nanotube is larger that the nanotube to be shaped to exhibit the desired contour.

19. The method of claim 1, wherein the desired contour is tapered.

20. A method for shaping a three-dimensional solid article, comprising the steps of:
    (a) providing a three-dimensional solid article and
    (b) using a shaping electrode comprising a nanotube to remove material from a portion of the three-dimensional solid article such that the solid article is controllably shaped to exhibit a desired contour, wherein material removal is carried out while the solid article and the shaping electrode are under a potential difference.

21. The method of claim 20, wherein the solid article is comprised of material having a layered structure.

22. The method of claim 20, wherein the step (b) comprises removing a layer of material from a portion of the solid article.

23. The method of claim 20, wherein at least one dimension of the solid article does not exceed about 100 nm in length.

24. A method for shaping a nanotube, comprising removing material from a portion of a nanotube through controlled application of energy until the nanotube exhibits a desired contour, wherein material removal is carried out without need for a chemical etchant.

* * * * *